US009316690B2

(12) United States Patent
Zuo et al.

(10) Patent No.: US 9,316,690 B2
(45) Date of Patent: Apr. 19, 2016

(54) DATA RECIRCULATION IN CONFIGURED SCAN PATHS

(75) Inventors: Songlin Zuo, San Diego, CA (US); Michael Laisne, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1010 days.

(21) Appl. No.: 13/044,190

(22) Filed: Mar. 9, 2011

(65) Prior Publication Data

US 2011/0231720 A1   Sep. 22, 2011

Related U.S. Application Data

(60) Provisional application No. 61/315,756, filed on Mar. 19, 2010.

(51) Int. Cl.
*G01R 31/28* (2006.01)
*G01R 31/3185* (2006.01)
*G01R 31/317* (2006.01)

(52) U.S. Cl.
CPC ........... *G01R 31/318544* (2013.01); *G01R 31/318572* (2013.01); *G01R 31/31716* (2013.01)

(58) Field of Classification Search
USPC ........................................................ 714/729
See application file for complete search history.

(56) References Cited

U.S. PATENT DOCUMENTS

| | | | | |
|---|---|---|---|---|
| 6,028,983 A * | 2/2000 | Jaber | ............... | G01R 31/318536 714/30 |
| 6,889,369 B1 * | 5/2005 | Clifton et al. | ................. | 716/113 |
| 2003/0149925 A1 * | 8/2003 | Angelotti | ......... | G01R 31/31813 714/726 |
| 2004/0225938 A1 * | 11/2004 | Smith | ............ | G01R 31/318594 714/726 |
| 2005/0005217 A1 * | 1/2005 | Whetsel | ......... | G01R 31/318508 714/727 |
| 2006/0161826 A1 * | 7/2006 | Ghisiawan | ...... | G01R 31/318566 714/726 |
| 2007/0011542 A1 * | 1/2007 | Mukherjee | ..... | G01R 31/318541 714/738 |
| 2009/0144592 A1 | 6/2009 | Chakraborty et al. | | |
| 2010/0229058 A1 * | 9/2010 | Goyal | ............ | G01R 31/318558 714/731 |
| 2010/0281319 A1 * | 11/2010 | Whetsel | ......... | G01R 31/318555 714/733 |
| 2011/0083195 A1 * | 4/2011 | Crouch | .......... | G01R 31/318558 726/27 |

FOREIGN PATENT DOCUMENTS

EP   1351066 A1   10/2003

OTHER PUBLICATIONS

Author: Ken Posse, Al Crouch, Jeff Rearick; Title: IEEE P1687 IJTAG; Date : 2009; Publisher: IEEE; Edition: 978-1-4244-4867-8/09.*

(Continued)

*Primary Examiner* — April Y Blair
*Assistant Examiner* — Thien D Nguyen
(74) *Attorney, Agent, or Firm* — Linda G. Gunderson

(57) ABSTRACT

An Automated Test Equipment (ATE) system is configured to test a Device Under Test (DUT). The ATE system stores a Procedure Description Language program. The ATE system interprets the program, thereby causing a configured scan path to be set up in the DUT and causing bit values to be loaded into that scan path. During testing, it is sometimes desirable to change only bit values in certain scan path bit locations. In a data recirculation operation, the ATE system shifts bit values, on a bit-by-bit basis, out of the configured scan path via the TDO terminal of the DUT and shifts back in either the shifted out bit value or a replacement bit value. The shift back into the configured scan path occurs via the TDI terminal of the DUT so that each bit value in the scan path is replaced with its previous value or a replacement value.

19 Claims, 12 Drawing Sheets

(56) References Cited

OTHER PUBLICATIONS

Author: Intellitech; Title: Develop—Simulate—Validate JTAG/IJTAG based IP using NEBULA Date: 2013 Publisher: http://www.intellitech.com/ijtag/.*

International Search Report and Written Opinion—PCT/US2011/029094—ISA/EPO—Jun. 21, 2011.

Zoran Stamenkovic et al.,"Combining internal scan chains and boundary scan register: A case study", EUROCON 2009, IEEE, Piscataway, NJ, USA, May 18, 2009, pp. 2064-2069, XP031492150.

* cited by examiner

CONFIGURABLE SCAN PATH

DATA REGISTER BIT

CONFIGURABLE SCAN PATH WHERE SCAN PATH
MANAGEMENT DATA REGISTERS CONTAIN POWER-UP
DATA BIT VALUES

CONFIGURABLE SCAN PATH WITH
CONFIGURATION DATA SHIFTED INTO SCAN PATH
MANAGEMENT DATA REGISTERS

CONFIGURABLE SCAN PATH WITH CONFIGURATION DATA VALUES
SHIFTED INTO SCAN PATH MANAGEMENT DATA REGISTERS AFTER
UPDATING THE CONTENTS OF THE DATA REGISTER

BIT VALUE D0 IS SHIFTED OUT AND RELOADED
INTO CONFIGURED SCAN PATH 1

BIT VALUE D0 IS STORED IN BIT LOCATION BIT24

BIT VALUE D2 IS SUBSTITUTED WITH REPLACEMENT BIT VALUE D2R

BIT VALUE D1 IS SHIFTED OUT AND RELOADED INTO CONFIGURED SCAN PATH 1

AN INTEGRATED CIRCUIT WITH MULTIPLEXER SHOWING
RELOADING OF A SHIFTED-OUT DATA BIT.

DATA RECIRCULATION IN JTAG SCAN CHAINS
FOR DATA PRESERVATION

DATA RECIRCULATION IN CONFIGURED SCAN PATHS

CROSS-REFERENCE TO RELATED APPLICATION

This application claims the benefit under 35 U.S.C. §119 of Provisional Application Ser. No. 61/315,756, filed Mar. 19, 2010, entitled "Data Recirculation In Scan Chains For Data Preservation", by Songlin Zuo et al., said provisional application is incorporated herein by reference.

BACKGROUND INFORMATION

1. Technical Field

The disclosed embodiments relate to the testing of integrated circuits.

2. Background Information

Printed Circuit Boards (PCBs) may contain several Integrated Circuit (IC) components, where each component may have hundreds of Input and Output (I/O) terminals. These components may also be attached to the printed circuit boards in a manner that makes it difficult to examine and test electrical connections to each component and the connections from one component to another. Automated test methods and systems exist for testing printed circuit boards and ensuring the robustness of electrical connections made during the manufacture of these systems.

IEEE Standard 1149 from the Institute of Electrical and Electronics Engineers (IEEE) is a standard that specifies one such test system. The 1149 standard is commonly referred to as "JTAG" (Joint Test Action Group). The 1149 standard specifies communication between Automated Test Equipment (ATE) systems and integrated circuit components. An 1149 standard compliant component contains Test Access Ports (TAP), a TAP controller, and instruction and data registers. The ATE system issues instructions to the TAP controller of a component so that the ATE system is able to provide stimulus data to the component and is able to receive and capture test data output from the component. Data provided to a component from the ATE system is typically shifted into the boundary scan register. The boundary scan register is a type of data register within the component. The ATE system can also receive data from the component by shifting out the contents of the boundary scan registers within the component. An ATE system may use various techniques for loading data into and reading data out of an IC component on a PCB.

Such loading of data into and reading data out of a data register can be accomplished by first shifting out previously stored data and then subsequent loading of the data register by shifting new data into the data register. If previously stored data exists in the data register of a component, the ATE system may shift out the data in the boundary scan register by sending instructions to the TAP controller of a component via test access terminals and then subsequently clocking the Test Clock (TCK) terminal until all previously stored data has been shifted out of the boundary scan register and is stored within a memory storage device within the ATE system. Once the data is received by the ATE system, the ATE system modifies all or a portion of the data and stores it before shifting that data back into the component's boundary scan register. The ATE system then takes this modified data and loads it back into the boundary scan register by issuing instructions to the component's TAP controller and clocking the TCK terminal. This process is repeated until testing of the PCB is complete.

Another method of testing an IC device is accomplished by storing several patterns of data within a memory storage device of an ATE system and simultaneously shifting out previously stored data within the component's data register and shifting in the next pattern of data. The ATE system issues instructions to the TAP controller of the component and causes data to shift out of the boundary scan register and as the previously stored data is shifted out of the boundary scan register, the next data pattern is provided at the input of the boundary scan register. As previously stored data is shifted out of the component's boundary scan register, the ATE device causes the data from the next data pattern to be loaded into the boundary scan register. When the existing data is completely shifted out, the next data pattern is already shifted into the boundary scan registers. This process is then repeated until testing of the PCB is complete.

A proposal by the Institute of Electronic and Electrical Engineers (IEEE), the P1687 standard (commonly referred to as IJTAG), is a proposed test standard that includes more integrated circuit or component level test features. Data registers as specified by the proposed P1687 standard are dynamically configurable. This allows testing of selected portions of an integrated circuit Device Under Test (DUT). During some IJTAG test operations, it may be necessary to modify a data value within a single selected register or within a selected subset of registers. The IJTAG standard may require some instructions to modify only the data values within a selected register or group of registers and to leave data values in all other registers unaltered. Improved methods of preloading and sampling of the data registers of a P1687 compliant system are desired.

SUMMARY

An Automated Test Equipment (ATE) system is configured to test a Device Under Test (DUT) having a configurable scan path. The ATE system stores a Procedure Description Language (PDL) program. The ATE system interprets the program, thereby causing a configured scan path to be set up in the DUT and causing bit values to be loaded into that scan path. During testing or debugging, it is sometimes desirable only to change bit values in certain scan path bit locations and not to change bit values in other locations. The ATE system shifts out bit values, on a bit-by-bit basis, out of a TDO (Test Data Out) terminal of the DUT and shifts in either the shifted out bit value or a replacement bit value for the shifted out bit value. The shifted in value is shifted into a TDI (Test Data In) terminal of the DUT thereby replacing each bit value in the configured scan path with its previously stored bit value or a replacement bit value.

In one embodiment, a PDL command is interpreted by the interpreter. The PDL command (for example, an iWrite command) specifies both a bit value location in a configured scan path as well as a replacement bit value. The ATE system carries out the operation specified by the PDL command. The ATE system carries out the operation by shifting a bit out of the configured scan path and selectively replacing the bit value and shifting either the shifted out bit value or the replacement bit value into the configured scan path, and doing this on a bit-by-bit basis for each bit of the configured scan path. In another embodiment, the DUT includes a hardware multiplexer that performs the selective bit-by-bit replacement on the DUT.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 10 is a diagram of a subsequent step of interpreting the program of FIG. 1. The diagram illustrates how bit value D1 is shifted out of the configured scan path of FIG. 8 and how bit value D0 is shifted in.

FIG. 11 is a diagram of a subsequent step of interpreting the program of FIG. 1. The diagram illustrates how bit value D2 is shifted out of the configured scan path of FIG. 8 and how bit value D1 is shifted in.

FIG. 12 is a diagram of a subsequent step of interpreting the program of FIG. 1. The diagram illustrates how bit value D3 is shifted out of the configured scan path of FIG. 8 and how replacement bit value D2R is shifted in.

DETAILED DESCRIPTION

Figure 1:
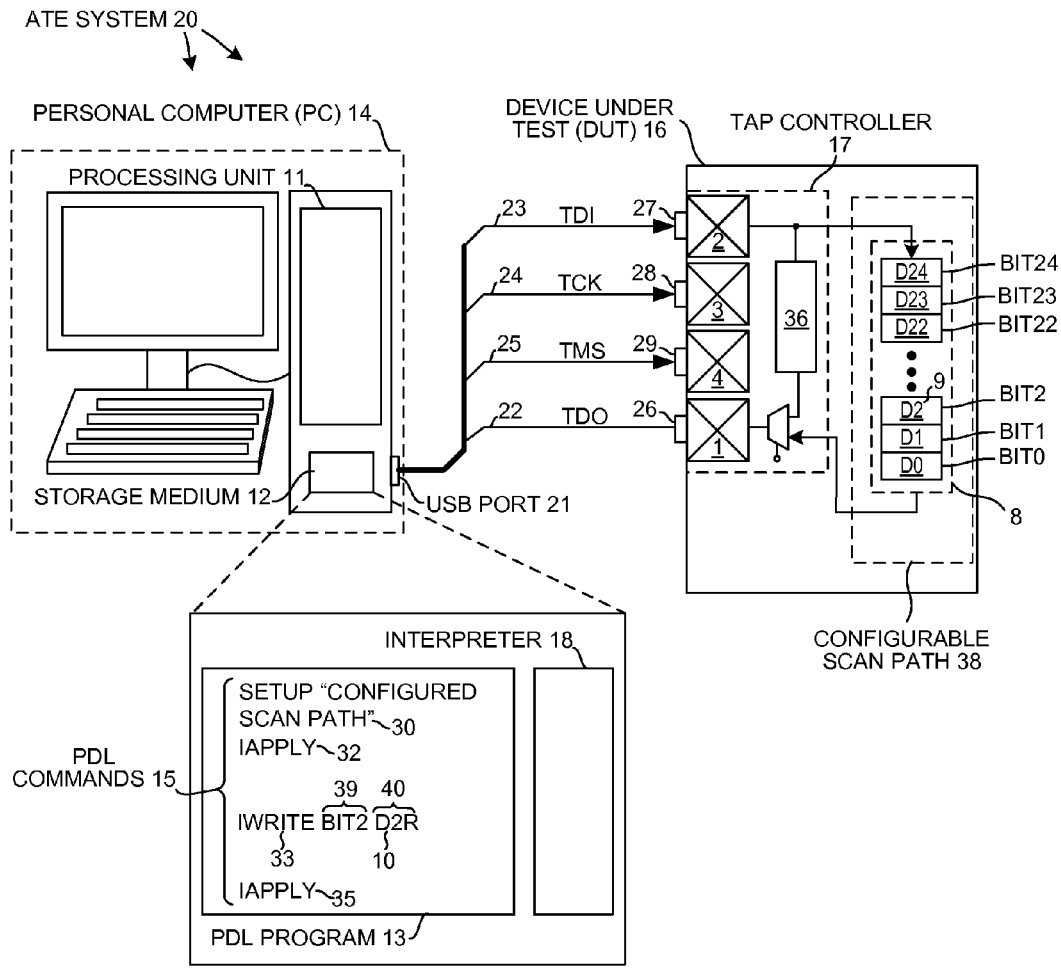
FIG. 1 is a diagram of an ATE system and a Device Under Test (DUT) where the ATE system stores and interprets an example of a program of PDL commands.

FIG. 1 is a diagram showing an Automated Test Equipment (ATE) system 20 and a Device Under Test (DUT) 16. The ATE system 20 in this particular example includes a personal computer (PC) 14, a first conductor 22, a second conductor 23, a third conductor 24, a fourth conductor 25, a first terminal 26, a second terminal 27, a third terminal 28, and a fourth terminal 29. The DUT may be an Integrated Circuit (IC) and includes a configurable scan path 38, a configured scan path 8, a Test Access Port (TAP) controller 17. TAP controller 17 includes a Test Data Out (TDO) terminal 1, a Test Data In (TDI) terminal 2, a Test Clock (TCK) terminal 3, a Test Mode Select (TMS) terminal 4, and an Instruction Register (IR) 36. ATE terminals 26-29 can be made to contact DUT terminals 1-4 so that DUT 16 can be tested by the ATE system 20, and then ATE terminals 26-29 can be disconnected from DUT terminals 1-4.

Configured scan path 8 of DUT 16 is an IEEE P1687 proposed standard compliant data register and includes a plurality of data bit locations, denoted BIT0 through BIT24. The plurality of data bit locations stores a plurality of corresponding bit values D0 through D24. For example, BIT2 of configured scan path 8 contains the data bit value "D2" 9. Each bit location within configured scan path 8 has a test data input lead and a test data output lead. The bit locations are connected serially; the test data output lead of one bit location connects to the test data input lead of the next bit location in a configured scan path. The test data input lead of bit location BIT24 is coupled to TDI terminal 2 and the test data output lead of bit location BIT0 is coupled to TDO terminal 1. In some embodiments, the configured scan path 8 is a shift register that is not IEEE P1687 compliant.

The Personal Computer (PC) 14 includes a processing unit 11, a storage medium 12, and a Universal Serial Bus (USB) port 21. The storage medium 12 is a computer-readable medium and may be a magnetic disk drive or other type of computer-readable medium and includes a Procedure Description Language (PDL) program 13 and an interpreter 18. Interpreter 18 includes an interpreter program for interpreting PDL program 13. The PC 14 storage medium 12, interpreter 18, conductors 22-25, and terminals 26-29 together constitute a command interpreting mechanism.

The PDL program 13 contains a set of PDL commands 15 including: SETUP "Configured Scan Path" command 30, IWRITE command 33, and IAPPLY commands 32 and 35. IWRITE command 33 includes a bit location field 39, replacement bit field 40, and replacement bit value 10. A replacement bit value is a data value that will replace a data value that was previously stored in a bit location or a data value that was loaded into a bit location during power up of the DUT. Select PDL commands 15 of PDL program 13 identify which bit locations of configured scan path 8 will be replaced. For example, the command IWRITE 33 identifies a bit location, BIT2, of the configured scan path 8 that will be loaded with the replacement bit value 10. The bit location identified as BIT2 in bit location field 39 is the bit location that will be loaded with the replacement bit value 10. The replacement bit value identity is also included in PDL program 13 and is identified as having the D2R replacement bit value 10 in replacement bit field 40. When the processing unit 11 causes interpreter 18 to interpret the PDL program 13, the processing unit causes ATE system 20 to start shifting out bit values from configured scan path 8 of the DUT 16 via the TDO terminal 1, first terminal 26, first conductor 22, and USB port 21. The ATE system either shifts the shifted out bit value back into configured scan path via USB port 21, second conductor 23, second terminal 27, and TDI terminal 2 or substitutes a replacement bit value for the shifted out bit value and shifts the replacement bit value back into configured scan path via USB port 21, second conductor 23, second terminal 27, and TDI terminal 2. (In other embodiments, the ATE system uses a communication specification other than USB to communicate with DUT 16. The USB mechanism is only described here by way of example.) The ATE system 20 repeats shifting of configured scan path 8 on a bit-by-bit basis until all bit values other than D2 are reloaded back into configured scan path 8. During the bit-by-bit shifting, ATE system 20 causes replacement of bit value D2 in BIT2 with the replacement bit value D2R as a result of the interpreting of PDL commands 15. In some embodiments previously stored bit values are not stored in storage medium 12 of ATE system 20 and replacement bit values may be identical to previously stored bit values that will be replaced by the replacement bit values.

Interpretation of PDL program 13 also causes the configuration of configured scan path 8. The ATE interprets the SETUP "configured scan path" command 30 and the IAPPLY command 32 and as a result shifts bit values for configuration of the configured scan path 8 into DUT 16 via TDI terminal 2 and transitioning TCK terminal 2. The SETUP command may be a command macro which includes a group of commands and in one novel embodiment, the ATE system interprets PDL program 13 and sends a plurality of JTAG commands to the DUT 16. The plurality of JTAG commands is received at Test Access Port 17 of DUT 16 and causes configuration of configured scan path 8. In another embodiment, the configuration of scan path 8 may be performed at power up of the integrated circuit and in this alternative embodiment configuration registers in configured scan path 8 are powered up in a known state.

Figure 2:
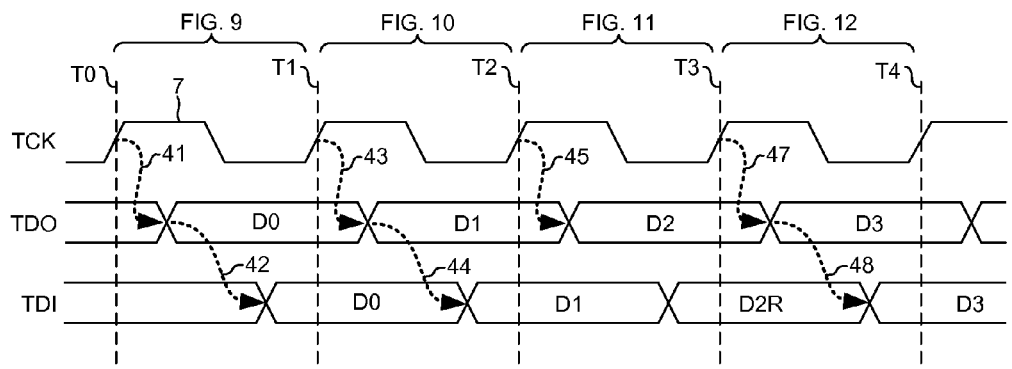
FIG. 2 is a waveform diagram of signals generated by the ATE system of FIG. 1 when interpreting and carrying out one of the PDL commands of the example of FIG. 1.

FIG. 2 is a diagram of signals generated by the ATE system of FIG. 1 during replacement of bit value D2 of configured scan path 8 with a replacement bit value D2R and reloading previously stored bit values back into all other bit locations of configured scan path 8. The signals shown in FIG. 2 are TCK 7, TDI, and TDO. The signal TCK 7 transitions at times T0-T4.

Figure 3:
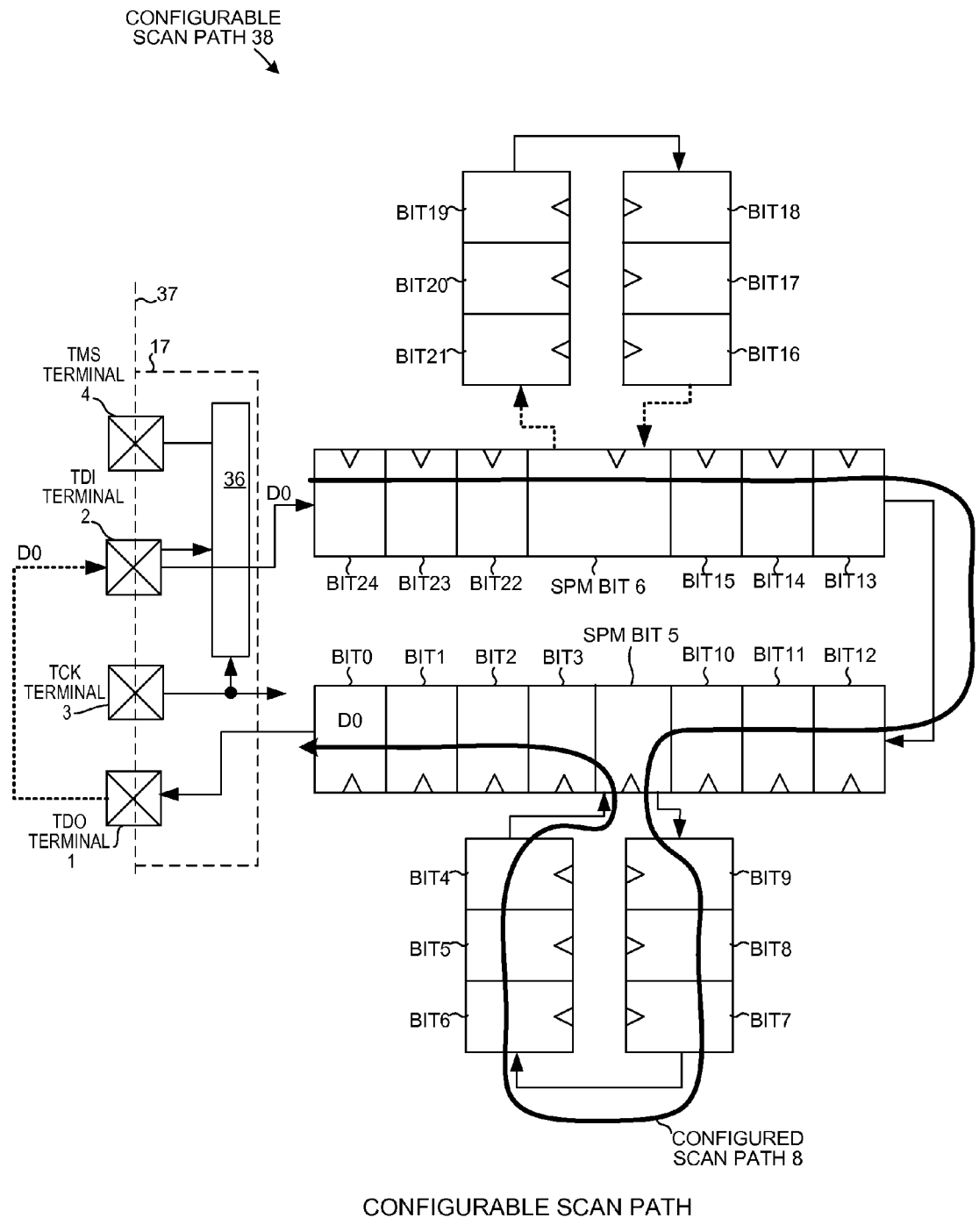
FIG. 3 is a diagram showing reloading of a previously stored bit value into a configured scan path in accordance with one novel aspect.

FIG. 3 is a drawing of the configured scan path 8 of FIG. 1 after the configurable scan path 38 has been configured by ATE system 20 to produce configured scan path 8. FIG. 3 shows a JTAG Test Access Port (TAP) controller 17 and the configured scan path 8 of an integrated circuit DUT. The JTAG TAP controller 17 includes a JTAG instruction register 36 and four test access terminals, Test Data Out (TDO) terminal 1, a Test Data In (TDI) terminal 2, a Test Clock (TCK) terminal 3, a Test Mode Select (TMS) terminal 4, at an integrated circuit boundary 37 of the integrated circuit DUT. Configured scan path 8 may be an IEEE P1687 compliant data register and includes bit locations BIT0 through BIT24. Each bit location BIT0 through BIT24 has a test data input lead and a test data output lead. Configured scan path 8 also includes a Scan Path Management bit location (SPM) BIT 5 and a second SPM bit location SPM BIT 6. The SPM bits are bit locations that allow inclusion or bypass of select configured scan path bit locations. For example, the bit location SPM BIT 5 can be configured (in a bypass mode) to couple the test data output lead of bit location BIT10 to the test data input lead of bit location BIT3. Alternatively, bit location SPM BIT 5 is configurable (in a non-bypass mode) to couple the test data output lead of bit location BIT10 to the test data input lead of BIT9 and to couple the test data output lead of BIT4 to the test data input lead of BIT3. Bit location SPM BIT 6 is similarly configurable to bypass bit locations BIT16 through BIT21 or include bit locations BIT16 through BIT21 in series between bit locations BIT15 and BIT22. FIG. 3 shows the result of SPM BIT 5 configured in the non-bypass mode and SPM BIT 6 in the bypass mode.

Figure 4:
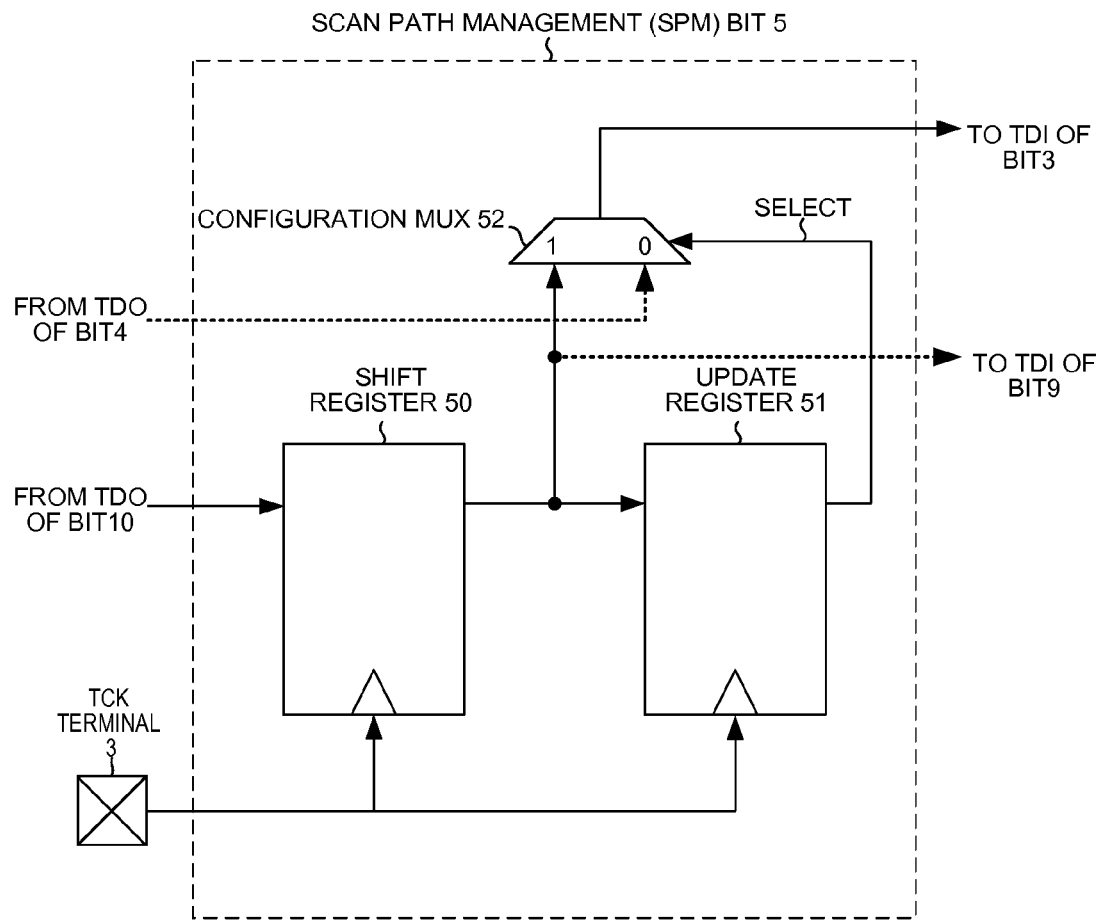
FIG. 4 is a diagram of the scan path management bit SPM BIT 5 of FIG. 3. used to configure the configured scan path of FIG. 3.

FIG. 4 is a diagram of the Scan Path Management (SPM) bit location SPM BIT 5 of FIG. 3. Bit location SPM BIT 5 includes shift register (flip-flop) 50, update register (flip-flop) 51, and configuration multiplexer 52. By loading the contents of the shift register 50 and issuing an update command to update register 51, configuration multiplexer 52 is configurable to connect the output of configuration multiplexer 52 to the test data input lead of bit location BIT3 or BIT9 of FIG. 3. The Automated Test Equipment (ATE) system 20 of FIG. 1 includes Procedure Description Language (PDL) commands 15 to configure the configured scan chain 8 of FIG. 3. By executing the PDL commands: "SETUP "CONFIGURED SCAN PATH 30," and IAPPLY 32 of PDL commands 15 of FIG. 1. ATE system 20 will configure scan path 8 by transmitting bit values for bit locations SPM BIT 5 and SPM BIT 6 of FIG. 3. After configured scan path 8 has been configured, the ATE may continue reloading or replacing bit values of configured scan path 8 of FIG. 1. The TAP controller 17 of FIG. 3. can cause an update operation to occur, thereby transferring the content of shift register 50 to the update register 51. In this manner the ATE system 20 configures the scan path. In another novel embodiment, the bit values for configuring the bit locations are loaded during power-up of the Device Under Test (DUT) 16 of FIG. 1.

Figure 5:
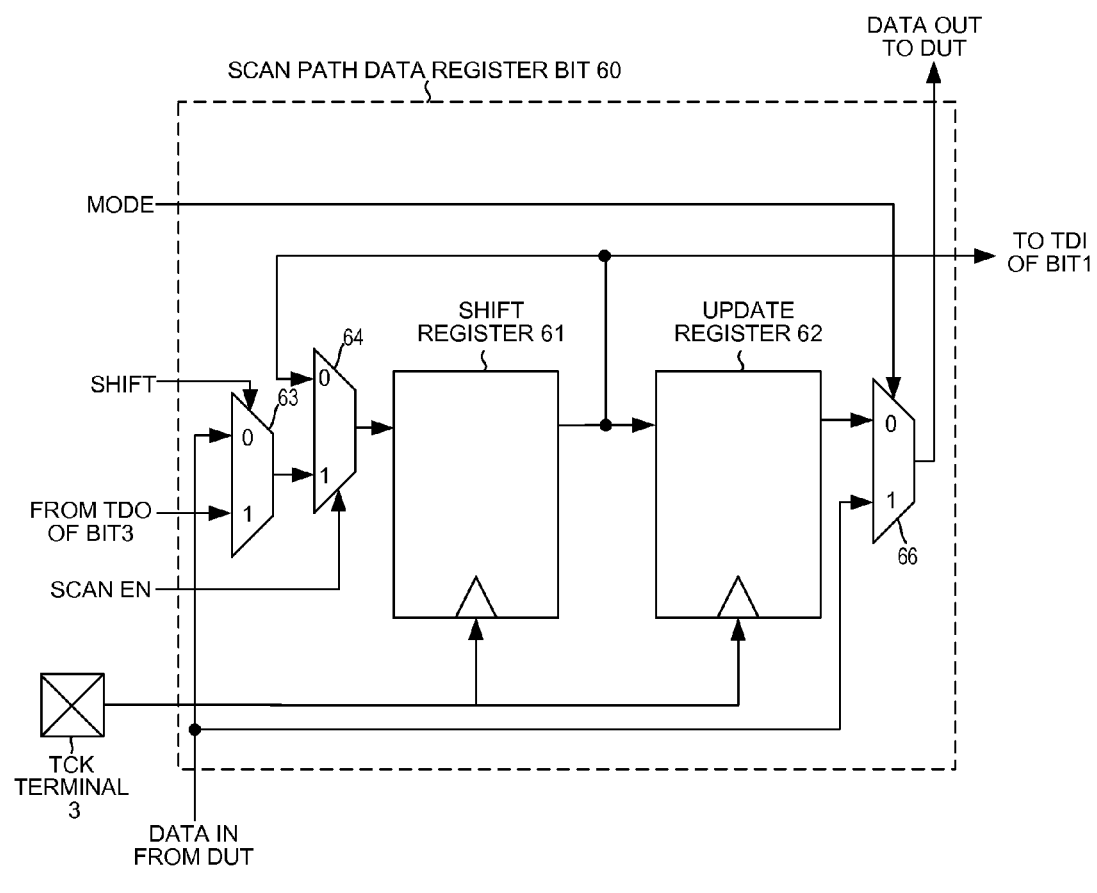
FIG. 5 is a diagram of a data register bit of a configured scan path.

FIG. 5 is a diagram of a scan path data register bit location such as BIT2 of FIG. 3. The scan path data register bit 60 includes a shift register (flip-flop) 61, an update register (flip-flop) 62, a shift multiplexer 63, a scan EN multiplexer 64, a mode multiplexer 66 and TCK terminal 3. The shift register 61 is connected between update register 62 and scan EN multiplexer 64. Scan EN multiplexer 64 is connected between shift register 61 and shift multiplexer 63. Scan EN multiplexer 64 is selectably controlled by the signal "scan EN" and selects either the shift output of shift register 61, data output from the DUT, or TDO from the upstream bit in the configured scan path 8. The output of scan EN multiplexer 64 is connected to the register input of shift register 61. Shift multiplexer 63 is selectably controlled by the signal "shift" and selects either TDO from the upstream bit in configured scan path 8 or data output from the DUT. Mode multiplexer 66 is connected between the DUT and update register 62. Mode multiplexer 66 is selectably controlled by the signal "mode" and selects either the shift output of update register 62 or data output from the DUT. The output of mode multiplexer 66 is connected to a DUT input. Signals Shift, Mode, and Scan EN are controlled by the TAP controller 17 of FIG. 3 and cause the shift register 61 to shift in bit values and replacement bit values from the upstream bit location of the scan path, data in from the DUT, or the register output of shift register 61. When shift register 61 is shifted by transitioning TCK, a data bit value can be shifted out of the upstream bit location of scan path 8 and shifted into shift register 61. Simultaneously with the shifting in of the bit value from bit location BIT3, the data bit value stored in shift register 61 will shift out to the test data input lead of the downstream bit location of scan path. The TAP controller 17 of FIG. 2 can also cause update register 62 to receive data stored in shift register 61 and output the data to the DUT via the test data out signal lead and mode multiplexer 66.

Figure 6:
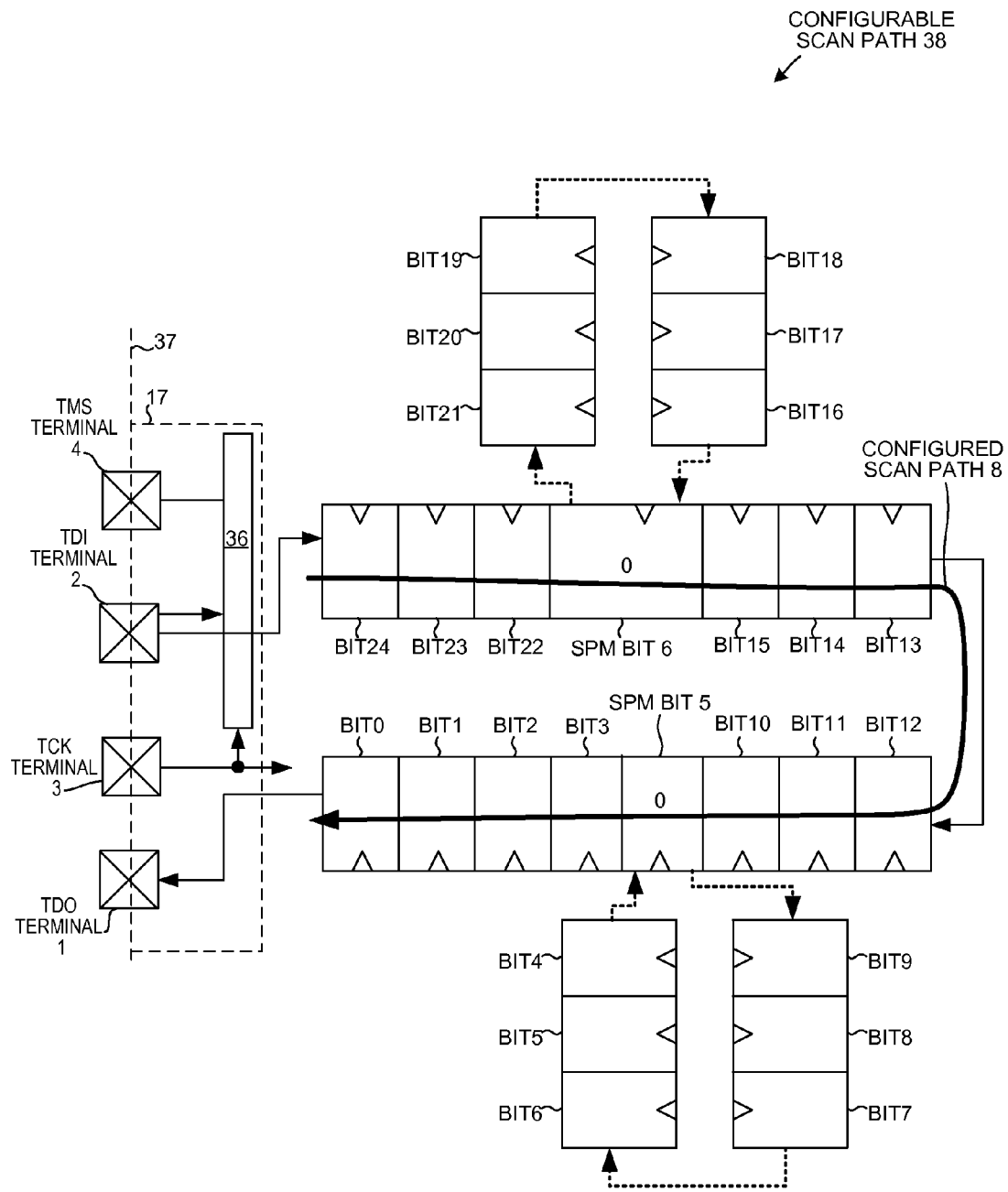
FIG. 6 is a diagram of an initial state of the configured scan path after power-up and before the program of FIG. 1 is interpreted.

FIG. 6 is a drawing of the configurable scan path 38 of FIG. 1 after ATE system 20 of FIG. 1 has powered up DUT 16 from a powered down state. The integrated circuit DUT includes a JTAG Test Access Port (TAP) controller 17 and a configured scan path 8. The JTAG TAP controller 17 includes a JTAG instruction register 36 and four test access terminals, Test Data Out (TDO) terminal 1, a Test Data In (TDI) terminal 2, a Test Clock (TCK) terminal 3, and a Test Mode Select (TMS) terminal 4, at an integrated circuit boundary 37 of the integrated circuit DUT. Configured scan path 8 may be an IEEE P1687 compliant data register and includes bit locations BIT0 through BIT24. Each bit location BIT0 through BIT24 has a test data input lead and a test data output lead. Configurable scan path 38 also includes a Scan Path Management bit location (SPM) BIT 5 and a second SPM bit location, SPM BIT 6. The SPM bits are bit locations that allow inclusion or bypass of select configured scan path bit locations. For example, the bit location SPM BIT 5 can be configured to control the shift data output of shift register 50 in SPM BIT 5 to connect to the test data input lead of bit location BIT3. Alternatively, bit location SPM BIT 5 is configurable to include bit locations BIT4 through BIT9 in series between shift register 50 of SPM BIT 5 and BIT3. Bit location SPM BIT 6 is similarly configurable to bypass bit locations BIT16 through BIT21 or include bit locations BIT16 through BIT21 in series between shift register 50 of SPM BIT 6 and BIT15. In this FIG. 6, bit locations SPM BIT 5 and SPM BIT 6 are initialized with preselected bit values during power-up of the DUT by ATE system 20 of FIG. 1. In particular SPM BIT 5 and SPM BIT 6 are initialized with the preselected bit values "0" at power-up. These bit values "0" cause the SPM bits to be in a bypass mode. The configured scan path 8 represents the path that data would shift through configurable scan path 38 if the registers were clocked by TCK. Due to SPM BIT 5 having a bit value "0," the scan path 8 does not go through register bits BIT4 through BIT9. Similarly due to SPM BIT2 having a bit value "0," the scan path 8 does not go through register bits BIT16 through BIT21.

Figure 7:
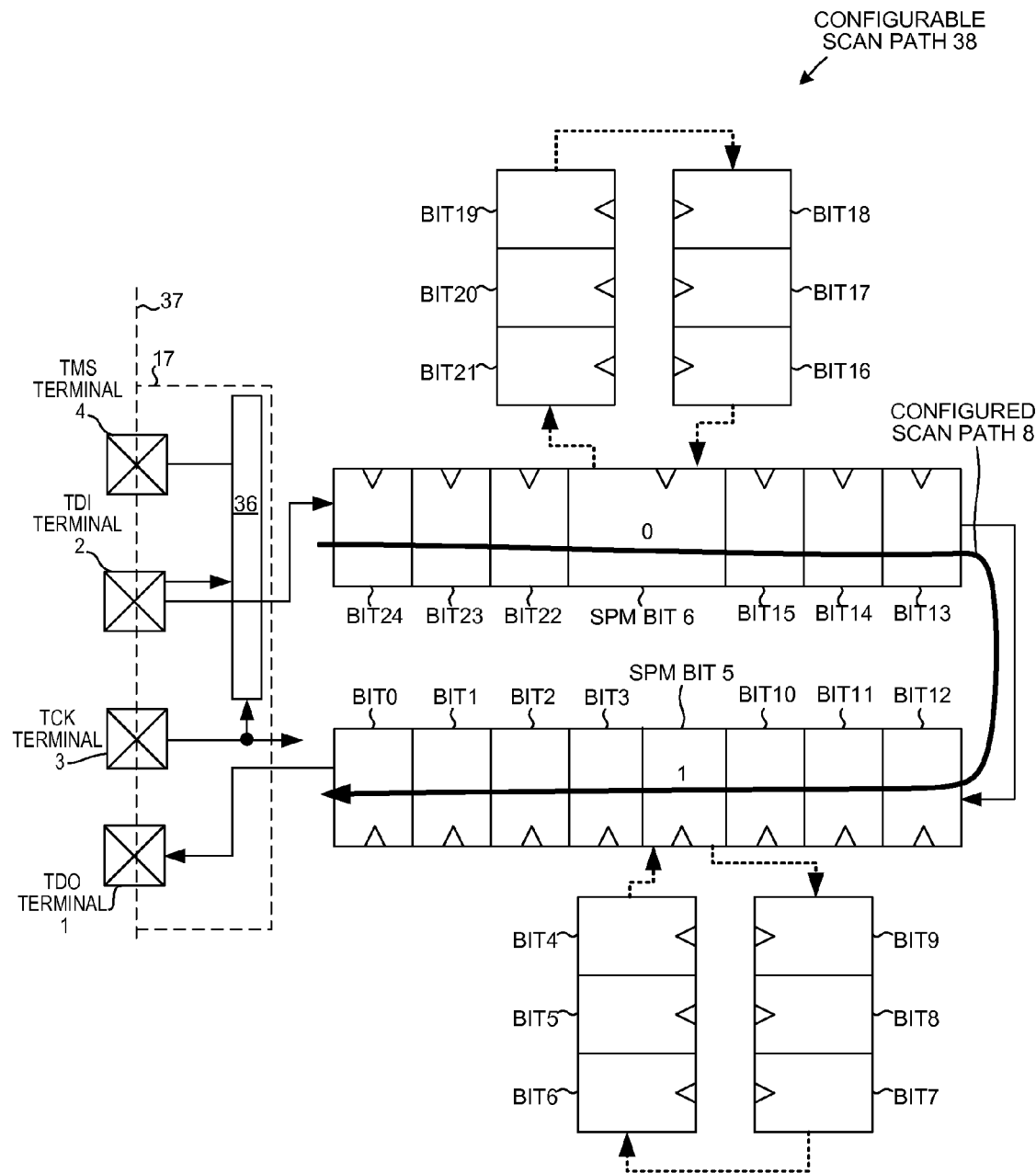
FIG. 7 is a diagram of a first step of interpreting the program of FIG. 1. The diagram illustrates loading a digital "1" into Scan Path Management (SPM) BIT 5 and loading a digital "0" into SPM BIT 6.

FIG. 7 shows a subsequent step in the setting up of configured scan path 8. In this FIG. 7 bit values are shifted through the scan path such at the end of the shifting SPM BIT 5 contains a "1" value and SPM BIT 6 contains a "0" value. The ATE system of FIG. 1 then causes an update operation to transfer the "1" value from the shift register in SPM BIT 5 to the update register in SPM BIT 5.

Figure 8:
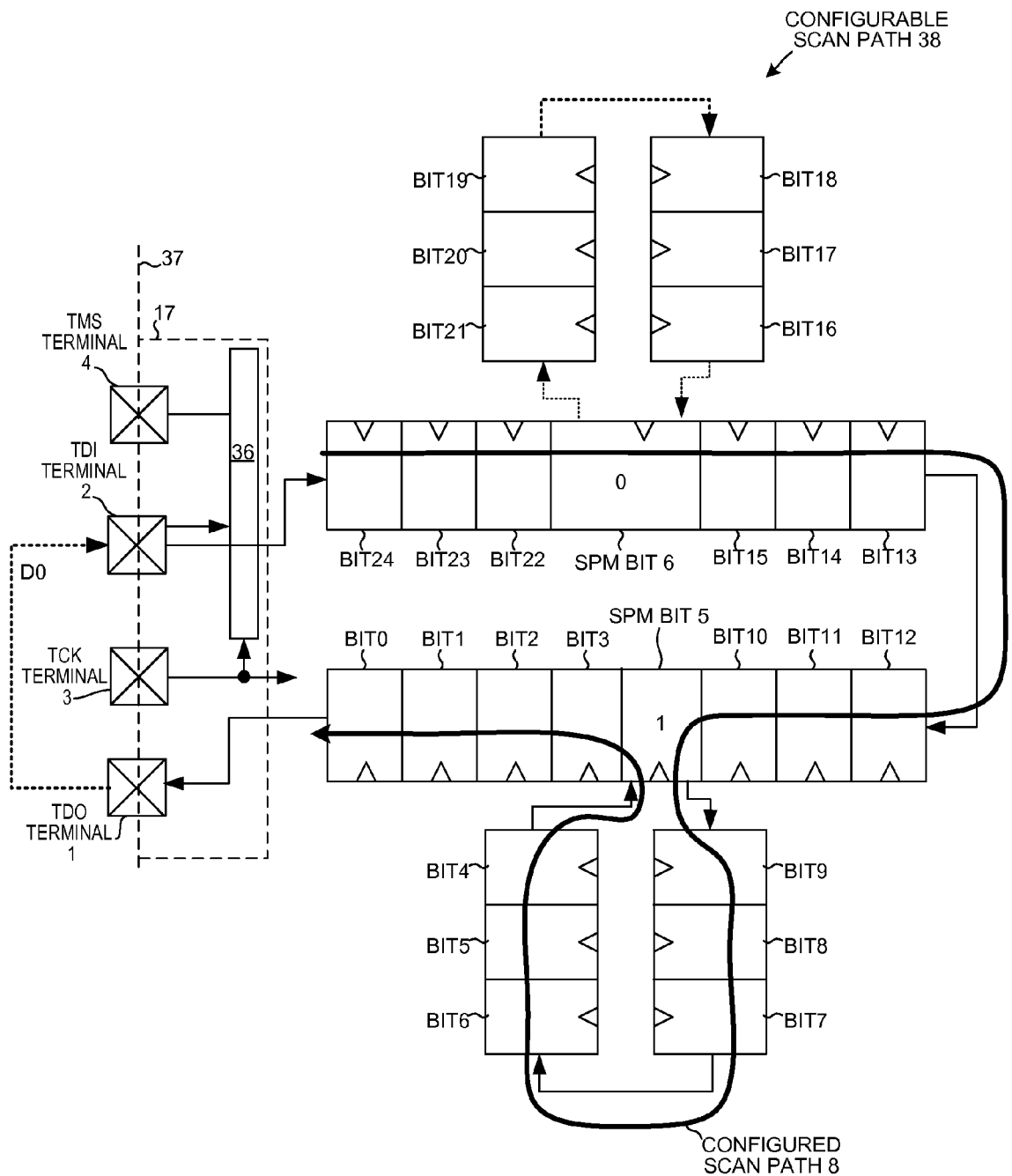
FIG. 8 is a diagram of a subsequent step of interpreting the program of FIG. 1. The diagram illustrates the condition of the configured scan path after SPM BIT 5 and SPM BIT 6 have been updated.

FIG. 8 shows the result of the update operation. The "1" value present in the update register in SPM BIT 5 causes the SPM BIT 5 to operate in a non-bypass mode and accordingly the configured scan path 8 now goes through bit locations BIT24 through BIT22, SPM BIT 6, BIT15 through BIT10, SPM BIT 5, and BIT9 through BIT4, SPM BIT 5, and BIT3 through BIT0 as illustrated. This concludes operations performed as a result of ATE system 20 of FIG. 1 interpreting the SETUP "Configured Scan Path" command 30 and the IAPPLY command 32.

FIGS. 9-13 set forth a sequence of operations performed as a result of interpreter 18 of FIG. 1. interpreting the IWRITE command 33 and executing it in response to the IAPPLY command 35. The IWRITE command 33 is a command that causes the bit location BIT2 in the configured scan path (identified by the BIT2 in bit location field 39 in the IWRITE command 33) to be replaced with the replacement bit value D2R (identified by the D2R in the bit replacement field 40 of the IWRITE command 33).

Figure 9:
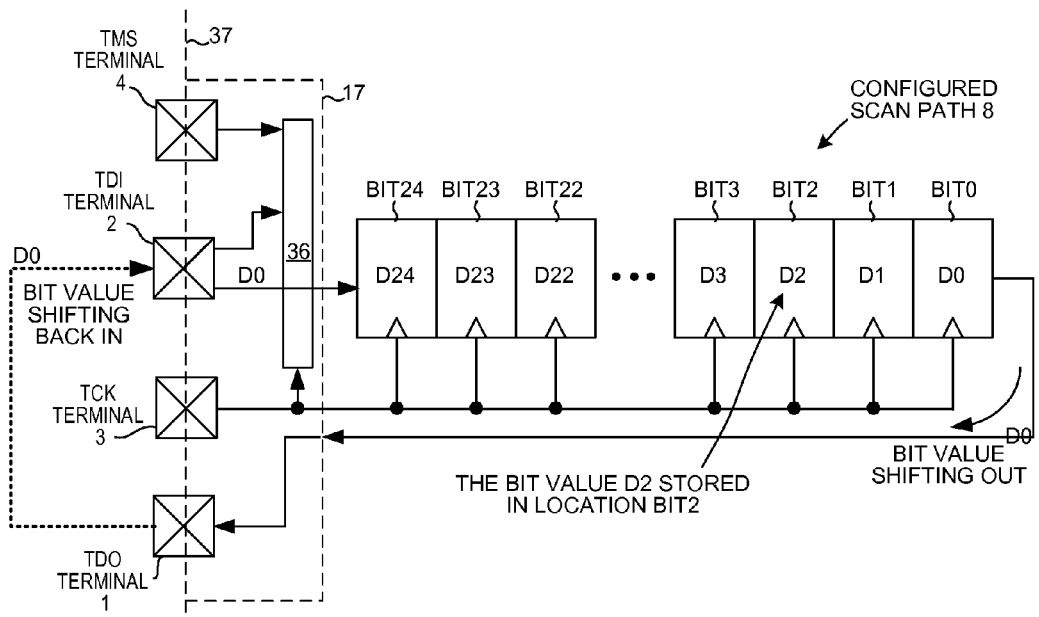
FIG. 9 is a diagram of a subsequent step of interpreting the program of FIG. 1. The diagram illustrates how bit value D0 is shifted out of the configured scan path of FIG. 8.

FIG. 9. is a diagram showing bit value D0 being reloaded into a configured scan path. Locations BIT0 through BIT24 contain previously stored bit values D0 through D24 respectively, and D0, the value contained in location BIT0, is present at the Test Data Out (TDO) terminal 1. The ATE system 20 caused a Test Clock (TCK) signal to transition low to high at a time T0. After a delay 41 bit value D0 shifted to the Test Data Out (TDO) terminal 1. The ATE system of FIG. 1 received the bit value D0 and stored it in storage medium 12 of personal computer 14 and after a delay 42, D0 is at the TDI input terminal 2.

Figure 10:
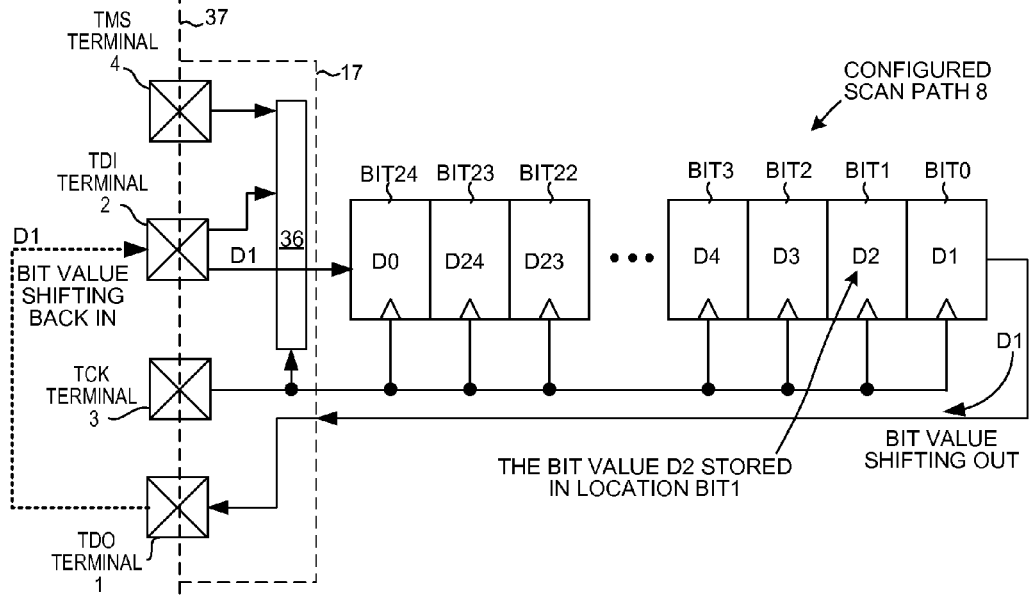

FIG. 10 is a diagram showing the configured scan chain 8 of FIG. 9. after the Test Clock (TCK) signal of FIG. 2. transitioned from low to high at time T1. In this FIG. 10, bit value D0 was reloaded after a time T1 into configured scan path 8 and stored in bit location BIT24. The processing unit 11 of Automated Test Equipment (ATE) system 20 transmitted bit value D0 stored in storage medium 12 to Test Data In (TDI) Terminal 2 via USB port 21, second conductor 23 and second terminal 27. Also after time T1, bit value D1 shifted from bit location BIT1 to BIT0 and is present at the output of BIT0 and is present at TDO terminal 1. The propagation from the T1 clock transition until bit value D1 appears at TDO terminal 1 is represented by arrow 43. Arrow 44 represents delay through the ATE system until the data is supplied back onto the TDI terminal 2.

Figure 11:
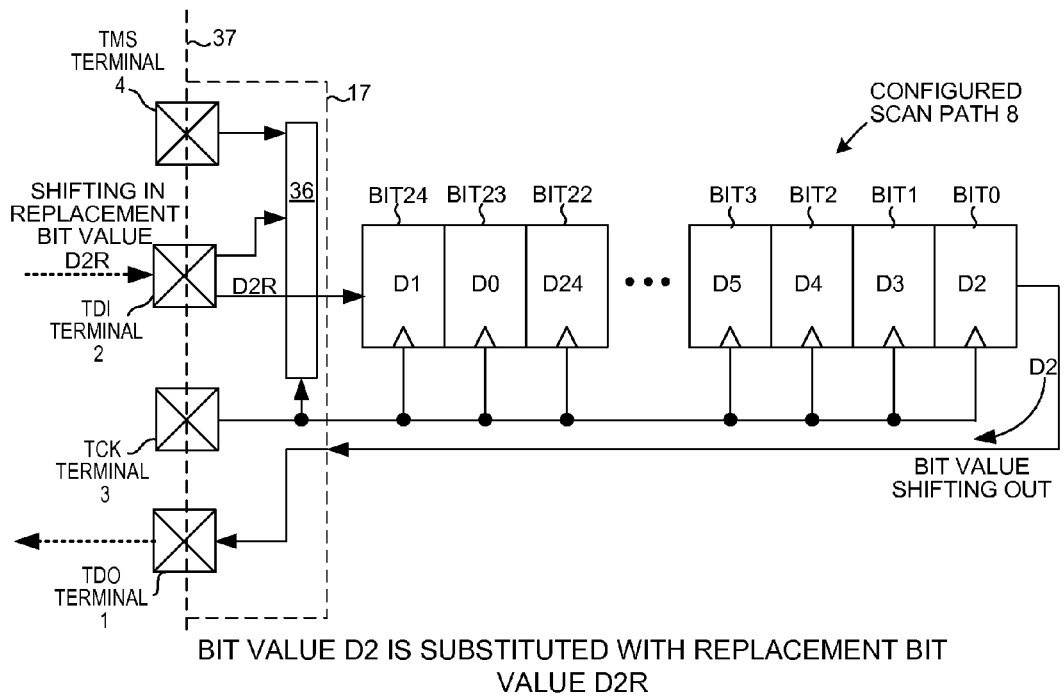

FIG. 11 is a diagram showing the configured scan chain 8 of FIG. 9. after the Test Clock (TCK) signal of FIG. 2. transitioned from low to high at time T2. In this FIG. 11, bit value D1 was reloaded after a time T1 into configured scan path 8 and stored in bit location BIT24. The processing unit 11 of Automated Test Equipment (ATE) system 20 transmitted bit value D1 stored in storage medium 12 to Test Data In (TDI) Terminal 2 via USB port 21, second conductor 23 and second terminal 27. Also after time T1, bit value D2 shifted from bit location BIT1 to BIT0 and is present at the output of BIT0 and is present at TDO terminal 1. The propagation from the T1 clock transition until bit value D2 appears at TDO terminal 1 is represented by arrow 45.

Figure 12:
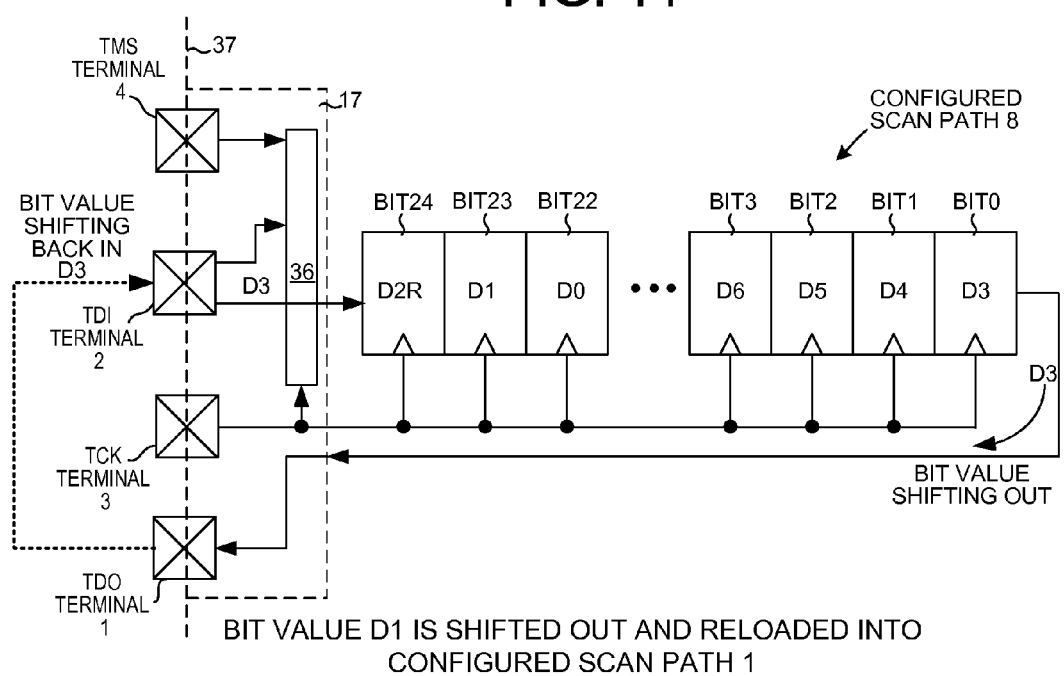

FIG. 12 shows that at a time T3 bit value D2R is clocked into BIT24 Also at time T3, bit value D3 is shifted from bit location BIT1 to BIT0 and appears at TDO terminal 1 after a delay represented by arrow 47. After another delay represented by arrow 48, the ATE system of FIG. 1 causes D3 to be supplied onto TDI terminal 2.

Figure 13:
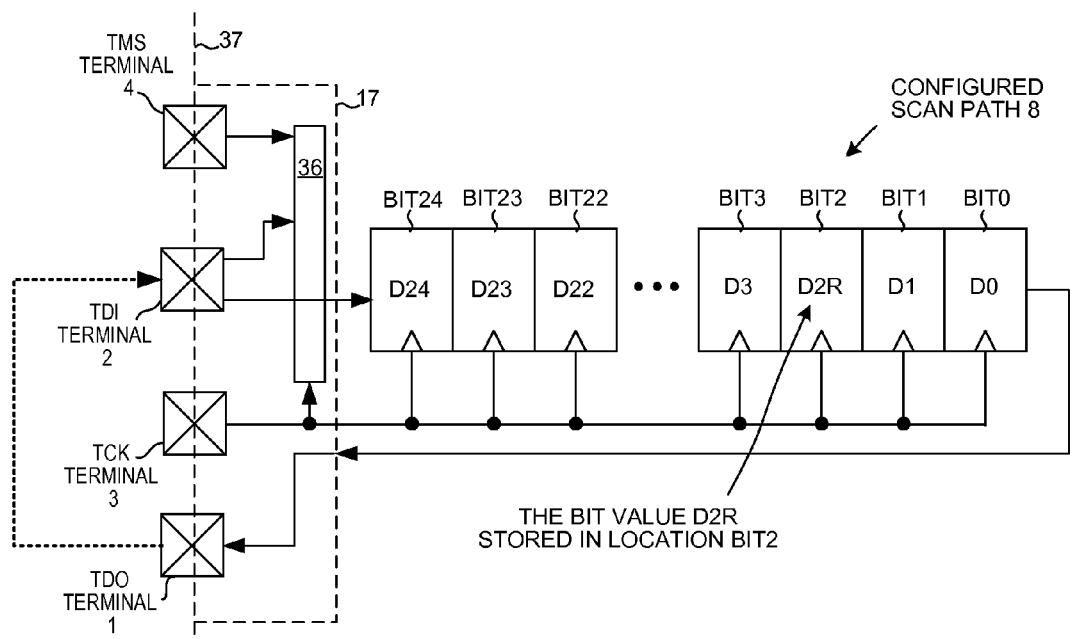
FIG. 13 is a diagram of a subsequent step of interpreting the program of FIG. 1. The diagram illustrates the condition of the configured scan path after all bits values have been either reloaded or replaced.

FIG. 13 is a diagram showing the configured scan chain 8 of FIG. 9. after the ATE system 20 of FIG. 1 has caused all previously stored bit values of configured scan path 8 to be reloaded with its prior data or replaced with a replacement bit value. In this FIG. 13, replacement bit value D2R is stored in bit location BIT2. Previously stored bit values were reloaded into all other bit locations including the SPM bit management locations, 5 and 6 of FIG. 8. During some test operations, bit values in the configured scan chain are only sampled or read. During these test operations, all bit locations are reloaded with its prior data without replacement of any bit values.

In some applications bit locations in the scan path contain bit values that are the results of testing the DUT. There is one conventional method of replacing data in the scan path where the ATE system stores the known bit values (such as the bit values the ATE previously shifted into the scan path), changes a selected one of the bit values, and then shifts the modified bit stream into the scan path. This conventional approach, however, can not be used to replace a bit value captured by testing the DUT because the test result may differ from expected results, therefore writing the expected value to such bit may overwrite the real test information from the DUT. The method described above in connection with FIGS. 1-13 preserves the test result data while achieving the objective of modifying only a selected bit value or bit values. In another conventional manner of testing the DUT, the ATE system does not know what bit values were previously loaded into the scan path. The ATE system must therefore read out the contents of the scan path, make desired replacements of the selected bit locations, and shift the modified bit stream back into the scan path. When reading, or shifting out, the contents of the scan path the ATE will inevitably shift new values into the scan path. These new values may adversely affect testing or debugging of the DUT. In addition, this conventional process also takes longer to complete than the method described by FIGS. 1-13. The conventional approach is even more burdensome when multiple test patterns are required to sufficiently test an integrated circuit DUT.

Figure 14:
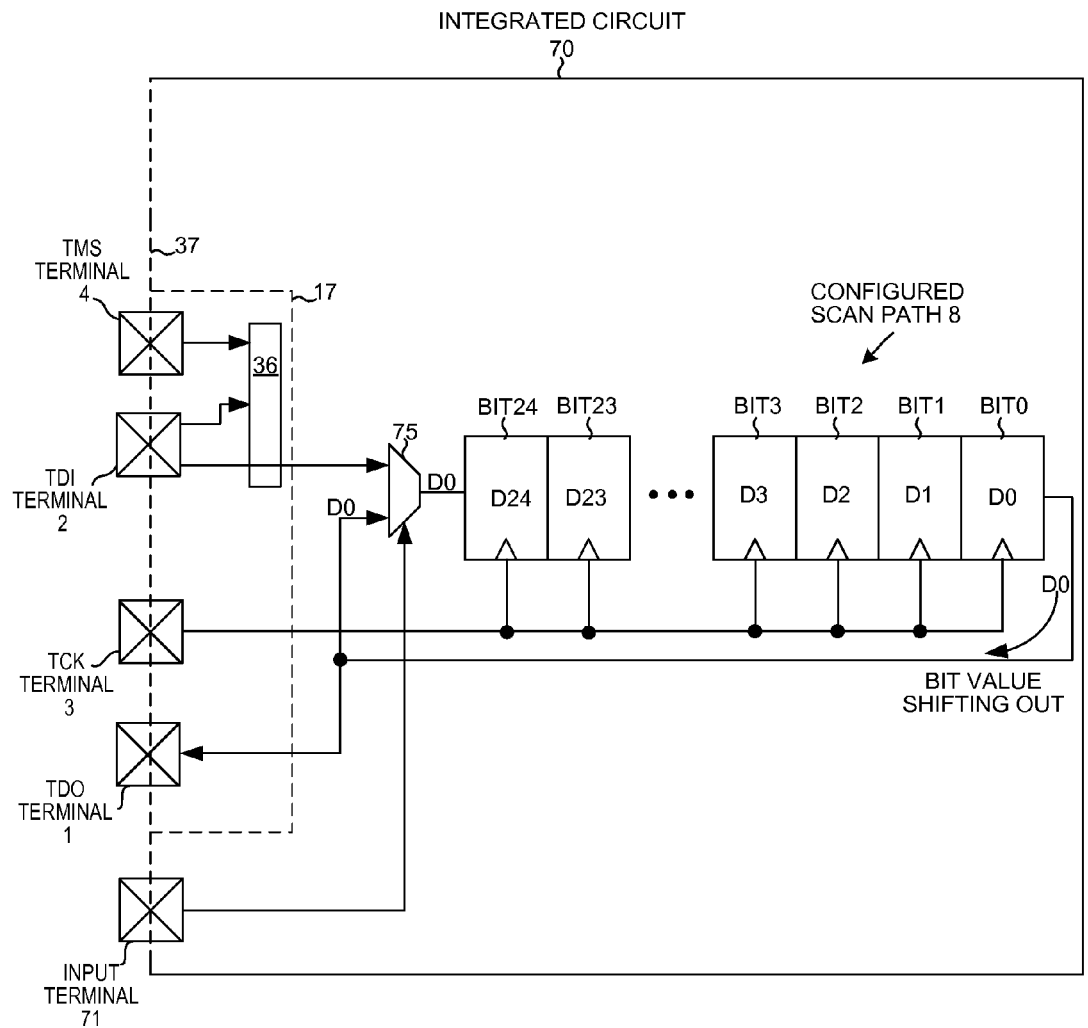
FIG. 14 is a diagram showing an integrated circuit that includes a multiplexer for reloading shifted-out bit values from a configured scan path.

FIG. 14 is a drawing of an integrated circuit 70. The boundary of integrated circuit 70 is denoted with dashed line 37. Integrated circuit 70 includes TAP controller 17, configured scan path 8, a two-to-one digital logic multiplexer 75, TMS terminal 4, TDI terminal 2, TCK terminal 3, TDO terminal 1, and an input terminal 71. Input terminal 71 is a terminal through which integrated circuit 70 receives control signals. Multiplexer 75 has an output, a first input, a second input, and a select input. The output of multiplexer 75 is coupled to the test data input lead of BIT24. The first input of multiplexer 75 is coupled to TDI terminal 2 and the second input of multiplexer 75 is coupled to the test data output lead of BIT0 of configured scan path 8. The select input of multiplexer 75 is coupled to input terminal 71. Input terminal 71 controls whether multiplexer 75 will reload previously stored bit values back into configured scan path 8 or if replacement bit values from TDI terminal 2 will be shifted into configured scan path 8. To reload previously stored bit values into scan path 8, input terminal 71 is driven with a signal such that multiplexer 75 couples the second input of multiplexer 75 to the output of multiplexer 75. Multiplexer 75 therefore receives bit values shifted out of the test data output lead of BIT0 of configured scan path 8 and supplies those bit values to the input lead of BIT24. To shift in replacement bit values, a replacement bit value is present at TDI terminal 2. Input terminal 71 is driven with a signal such that multiplexer 75 couples the first input of multiplexer 75 to the output of multiplexer 75. The replacement bit value on TDI terminal 2 passes through multiplexer 75 and onto the input lead of BIT24.

FIG. 14 shows multiplexer 75 configured to reload a previously stored bit value. Input terminal 71 selects the bit value from the test data output lead of BIT0 which is also present at TDO terminal 1. The bit value D0 at the test data output lead of BIT0 is present at TDO, the second input of multiplexer 75, the output of multiplexer 75, and at the test data input lead of BIT24 of configured scan path 8. When TCK terminal 3 is transitioned low to high, scan path registers BIT0 through BIT24 are shifted and the bit value D0 will be shifted into BIT24. Continued transitions of TCK terminal 3 will cause further shifting of scan path registers BIT0 through BIT24. By controlling the digital control value supplied onto the select input of multiplexer 75 and transitioning TCK terminal 3, configured scan path 8 can be shifted on a bit-by-bit basis until all the bit values previously stored in the configured scan path have been shifted out of the configured scan path and are either reloaded or replaced. In another novel embodiment the select input of multiplexer 75 is not controlled by an input pad or terminal but rather is controlled by logic on the integrated circuit 70. In yet another embodiment, logic or storage elements on integrated circuit 70 provide the data values to the first input of multiplexer 75.

In some embodiments, configured scan path 8 may contain an odd number of inversions. In such a case, an inverter is coupled between the test data output lead of BIT0 and the second input of multiplexer 75. The presence of the inverter ensures that the registers of configurable scan path 8 are correctly loaded with bit values and not inverted bit values. In yet other novel embodiments the processing unit 11 and storage medium 12 of FIG. 1. are included on a computing device other than a personal computer. In yet another novel embodiment, the DUT 14 of FIG. 1. does not contain a Test Access Port (TAP) controller and testing may be controlled through other terminals.

Figure 15:
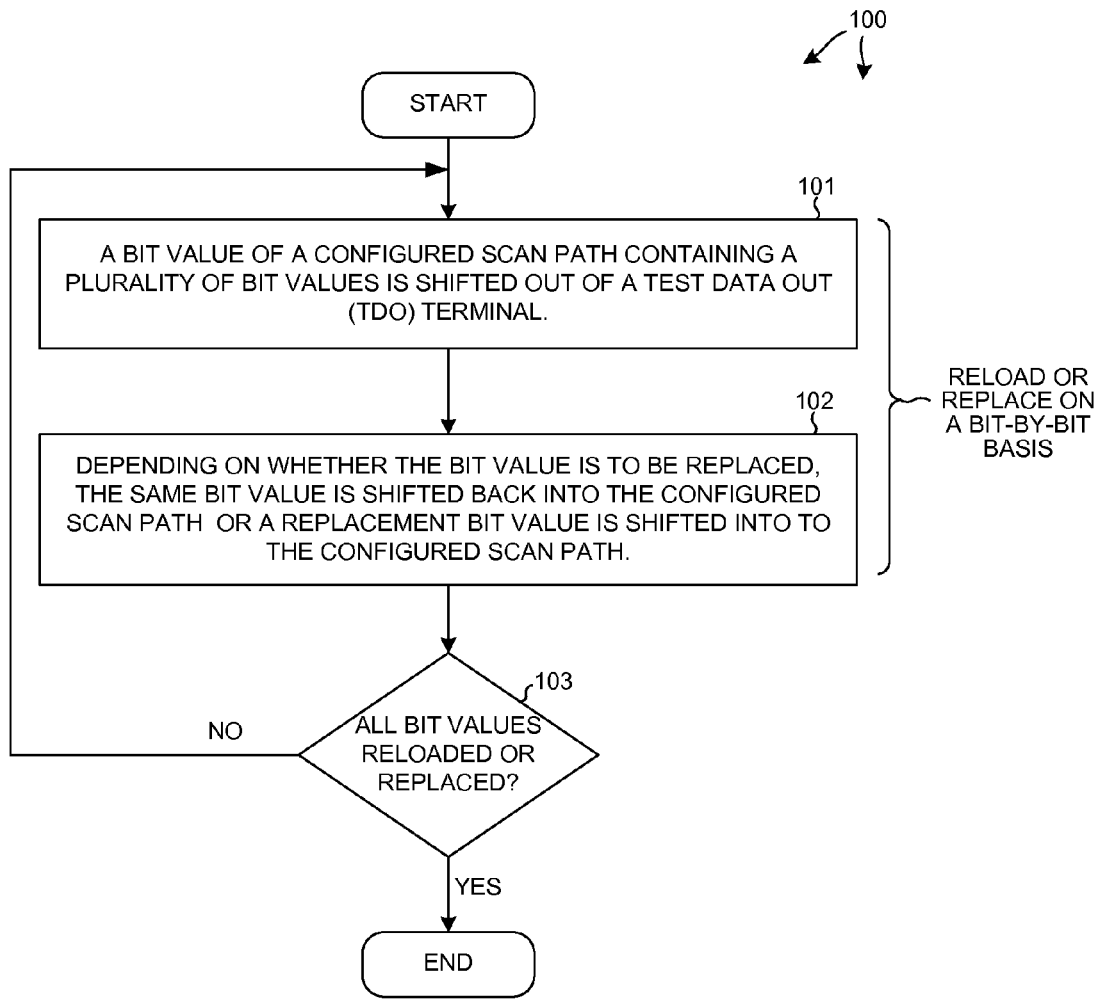
FIG. 15 is a flowchart of a method of loading a configured scan path with previously stored bit values or replacement bit values in accordance with one novel aspect.

FIG. 15 is a simplified flowchart of a method 100 in accordance with one novel aspect. During testing of a Device Under Test (DUT) a bit value of a configured scan path containing a plurality of bit values is shifted (step 101) out of a Test Data Out (TDO) terminal on a bit-by-bit basis. Depending on whether the bit value is to be replaced, the same bit value is shifted back (step 102) into the configured scan path or a replacement bit value is shifted into to the configured scan path. Steps 101 and 102 are repeated (step 103) on a bit-by-bit basis until each bit value in the configured scan path is either reloaded with its prior value or replaced with a replacement bit value.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one specific example, storage medium 12 is program memory and/or hard disk in the ATE device 20 that stores a set of computer-executable instructions (interpreter 18) as well as a PDL program (PDL program 13) of PDL commands (PDL commands 15).

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A method comprising:
    (a) receiving a bit value from a TDO (Test Data Out) terminal at an automated test equipment (ATE) system;
    (b) supplying a replacement bit value to a TDI (Test Data In) terminal and sending a control signal to an input terminal from the ATE system based on determining from a Procedure Description Language (PDL) command of a set of PDL commands whether a bit value of a configured scan path is to be replaced with the replacement bit value, wherein the control signal causes one of the bit value and the replacement bit value to be selected; and
    (c) transitioning a clock signal on a TCK (Test Clock) terminal such that the selected one of the bit value and the replacement bit value is shifted into the configured scan path on a bit-by-bit basis based on interpreting the set of PDL commands, wherein the configured scan path is shifted thereby outputting a new bit value onto the TDO terminal, and repeating (a) through (c), and wherein the set of PDL commands indicates selection of the replacement bit value for at least one scan path location of the configured scan path and selection of at least one bit value for at least one other scan path location of the configured scan path.

2. A method comprising:
(a) receiving a bit value at an automated test equipment (ATE) system from a first terminal;
(b) sending a control signal to a second terminal from the ATE system based on determining from a Procedure Description Language (PDL) command of a set of PDL commands whether a bit value of a configured scan path is to be replaced with the replacement bit value, wherein the control signal causes one of the bit value and a replacement bit value to be selected; and
(c) transitioning a clock signal on a third terminal such that the selected one of the bit value and the replacement bit value is shifted into the configured scan path on a bit-by-bit basis based on interpreting the set of PDL commands, wherein the configured scan path is shifted thereby causing the configured scan path to receive the bit value supplied in (b) and thereby causing the configured scan path to output a new bit value onto the first terminal, and repeating (a) through (c), and wherein the set of PDL commands indicates selection of the replacement bit value for at least one scan path location of the configured scan path and selection of at least one bit value for at least one other scan path location of the configured scan path.

3. The method of claim 2, wherein the first, second and third terminals are terminals of an integrated circuit, and wherein the configured scan path is a part of the integrated circuit.

4. A method comprising:
(a) shifting out a bit value to an automated test equipment system (ATE) from a configured scan path via a TDO (Test Data Out) terminal and sending a control signal to an input terminal from the ATE system based on determining from a procedure Description Language (PDL) command of a set of PDL commands whether a bit value of the configured scan path is to be replaced with the replacement bit value, such that in response to the control signal either the shifted out bit value is shifted back into the configured scan path or a replacement bit value is substituted for the shifted out bit value and the replacement bit value is shifted into the configured scan path via a TDI (Test Data In) terminal, wherein the configured scan path includes a plurality of bits, and wherein prior to (a) each bit of the configured scan path stored a corresponding bit value; and
(b) repeating (a) on a bit-by-bit basis for each successive bit value stored in the configured scan path based on interpreting the set of PDL commands, such that after all the bit values previously stored in the configured scan path have been shifted out via the TDO terminal each bit of the configured scan path was either reloaded to store its prior shifted out bit value or was loaded to store the replacement bit value, and wherein the set of PDL commands indicates selection of the replacement bit value for at least one scan path location of the configured scan path and selection of at least one bit value for at least one other scan path location of the configured scan path.

5. The method of claim 4, further comprising:
(c) setting up the configured scan path by executing a plurality of JTAG commands, wherein (c) is performed before (a) and (b).

6. An Automated Test Equipment (ATE) system comprising:
a storage medium storing a set of Procedure Description Language (PDL) commands;
a first terminal configured to couple to a Test Data Out (TDO) terminal of a Device Under Test (DUT);
a second terminal configured to couple to a Test Data In (TDI) terminal of the DUT;
a third terminal configured to couple to a Test Clock (TCK) terminal of the DUT;
a fourth terminal configured to couple to an input terminal of the DUT; and
a command interpreting mechanism configured to interpret the set of PDL commands and as a result of the interpreting uses the first, second, third and fourth terminals thereby causing:
(a) shifting out a bit value from a configured scan path of the DUT via the TDO terminal of the DUT and sending a control signal to the input terminal of the DUT based on determining from a PDL command of the set of PDL commands whether a bit value of the configured scan path is to be replaced with the replacement bit value, such that either the shifted out bit value is shifted back into the configured scan path or a replacement bit value is substituted for the shifted out bit value and the replacement bit value is shifted into the configured scan path via the TDI terminal of the DUT, wherein the configured scan path includes a plurality of bits, and wherein prior to (a) each bit of the configured scan path stored a corresponding bit value; and
(b) repeating (a) on a bit-by-bit basis based on interpreting the set of PDL commands for each successive bit value stored in the configured scan path such that after all the bit values previously stored in the configured scan path have been shifted out via the TDO terminal each bit of the configured scan path was either reloaded to store its prior shifted out bit value or was loaded to store the replacement bit value, and wherein the set of PDL commands indicates selection of the replacement bit value for at least one scan path location of the configured scan path and selection of at least one bit value for at least one other scan path location of the configured scan path.

7. The ATE system of claim 6, wherein the ATE system uses the first, second, third and fourth terminals to configure the configured scan path in the Device Under Test (DUT), and wherein the configuring of the configured scan path occurs before the interpreting of the set of PDL commands.

8. The ATE system of claim 6, wherein the configured scan path includes a scan path management bit.

9. The ATE system of claim 6, wherein the configured scan path is part of an IJTAG (Instrument Joint Test Access Group) compliant hierarchical scan path.

10. The ATE system of claim 6, wherein the set of PDL commands includes an iWrite command.

11. An Automated Test Equipment (ATE) apparatus comprising:
a storage medium configured to store a set of Procedure Description Language (PDL) commands; and
means for interpreting the PDL commands and as a result of the interpreting: (a) causing a bit value to be received from a TDO (Test Data Out) terminal of a Device Under Test (DUT); (b) causing a replacement bit value to be supplied to a TDI (Test Data In) terminal of the DUT; (c) causing a control signal to be sent to an input terminal of the DUT from the ATE system based on determining from a PDL command of the set of PDL commands whether a bit value of a configured scan path is to be replaced with the replacement bit value, wherein the control signal causes one of the bit value and the replacement bit value to be selected; (d) causing the selected one of the bit value and the replacement bit value to be shifted into the configured scan path of the DUT, thereby shifting the configured scan path and outputting a new bit value onto the TDO terminal, and repeating (a) through (d) on a bit-by-bit basis based on interpreting the set of PDL commands, and wherein the set of PDL commands indicates selection of the replacement bit value for at least one scan path location of the configured scan path and selection of at least one bit value for at least one other scan path location of the configured scan path.

12. The ATE apparatus of claim 11, wherein the means includes:
   a processor configured to execute an interpreter program; and
   a plurality of terminals configured to connect the means to the DUT.

13. A computer product, comprising:
   a non-transitory computer-readable medium storing codes executable to cause an apparatus to:
   (a) shift out a bit value from a configured scan path via a TDO (Test Data Out) terminal to an Automated Test Equipment (ATE) system and send a control signal from the ATE system to an input terminal based on determining from a Procedure Description Language (PDL) command of a set of PDL commands whether a bit value of a configured scan path is to be replaced with the replacement bit value, such that either the shifted out bit value is shifted back into the configured scan path or a replacement bit value is substituted for the shifted out bit value and the replacement bit value is shifted into the configured scan path via a TDI (Test Data In) terminal, wherein the configured scan path includes a plurality of bits, and wherein prior to (a) each bit of the configured scan path stored a corresponding bit value; and wherein the code is also executable to cause an apparatus to
   (b) repeat (a) on a bit-by-bit basis based on interpreting the set of PDL commands for each successive bit value stored in the configured scan path such that after all the bit values previously stored in the configured scan path have been shifted out via the TDO terminal each bit of the configured scan path was either reloaded to store its prior shifted out bit value or was loaded to store the replacement bit value, and wherein the set of PDL commands indicates selection of the replacement bit value for at least one scan path location of the configured scan path and selection of at least one bit value for at least one other scan path location of the configured scan path.

14. The computer product of claim 13, wherein the non-transitory computer-readable medium further comprises:
   code for configuring the configured scan path.

15. The computer product of claim 13, wherein the non-transitory computer-readable medium is a memory in the Automated Test Equipment (ATE) system.

16. The method of claim 1, wherein the sending the control signal to the input terminal further comprises causing a multiplexer to select one of the bit value and the replacement bit value.

17. The method of claim 2, wherein the sending the control signal to the second terminal further comprises causing a multiplexer to select one of the bit value and the replacement bit value.

18. The method of claim 4, wherein the sending the control signal to the input terminal further comprises causing a multiplexer to select one of the bit value and the replacement bit value.

19. The method of claim 4, further comprising configuring a scan path management bit included in the configured scan path, wherein the scan path management bit allows inclusion or bypass of select configured scan path bit locations.

* * * * *